(12) United States Patent
Nodin et al.

(10) Patent No.: US 9,018,614 B2
(45) Date of Patent: Apr. 28, 2015

(54) PHASE-CHANGE MEMORY CELL

(71) Applicants: STMicroelectronics (Crolles 2) SAS, Crolles (FR); Commissariat à l'Énergie Atomique et aux Énergies Alternatives, Paris (FR)

(72) Inventors: Jean-Francois Nodin, Quaix en Chartreuse (FR); Veronique Sousa, Grenoble (FR); Sandrine Lhostis, Theys (FR)

(73) Assignees: STMicroelectronics (Crolles 2) SAS, Crolles (FR); Commissariat à l'Énergie Atomique et aux Énergies Alternatives, Paris (FR)

( * ) Notice: Subject to any disclaimer, the term of this patent is extended or adjusted under 35 U.S.C. 154(b) by 0 days.

(21) Appl. No.: 14/018,223

(22) Filed: Sep. 4, 2013

(65) Prior Publication Data
US 2014/0070158 A1 Mar. 13, 2014

(30) Foreign Application Priority Data

Sep. 10, 2012 (FR) ...................................... 12 58471

(51) Int. Cl.
*H01L 47/00* (2006.01)
*H01L 45/00* (2006.01)

(52) U.S. Cl.
CPC ............ *H01L 45/1246* (2013.01); *H01L 45/06* (2013.01); *H01L 45/1233* (2013.01); *H01L 45/144* (2013.01); *H01L 45/165* (2013.01); *H01L 45/1683* (2013.01)

(58) Field of Classification Search
CPC .......................... H01L 45/1246; H01L 45/165
USPC .............................................................. 257/3
See application file for complete search history.

(56) References Cited

U.S. PATENT DOCUMENTS

| 7,550,313 B2 | 6/2009 | Arnold et al. |
| 2006/0166471 A1 | 7/2006 | Happ |
| 2010/0193780 A1* | 8/2010 | Smythe ........................ 257/42 |
| 2010/0283029 A1 | 11/2010 | Dennison et al. |
| 2011/0049456 A1 | 3/2011 | Lung et al. |
| 2011/0155985 A1 | 6/2011 | Oh et al. |

OTHER PUBLICATIONS

EP Search Report for EP 13183707 dated Oct. 15, 2013 (4 pages).
French Search Report and Written Opinion dated May 16, 2013 from corresponding French Patent Application No. 12/58471.

* cited by examiner

*Primary Examiner* — David S Blum
(74) *Attorney, Agent, or Firm* — Gardere Wynne Sewell LLP

(57) ABSTRACT

A memory cell including a via made of a phase-change material arranged between a lower electrode and an upper electrode, wherein the via includes a central region laterally surrounded with a peripheral region, the crystallization and melting temperatures of the central region being respectively lower than those of the peripheral region.

18 Claims, 4 Drawing Sheets

PHASE-CHANGE MEMORY CELL

CROSS REFERENCE TO RELATED APPLICATIONS

This application claims the priority benefit of French patent application serial number 12/58471, filed on Sep. 10, 2012, which is hereby incorporated by reference to the maximum extent allowable by law.

BACKGROUND

1. Technical Field

The present disclosure relates to a phase-change random access memory or PCRAM. The present disclosure also relates to a method for manufacturing such PCRAM cells.

2. Discussion of the Related Art

PCRAMs use materials called phase-change materials, which are capable of changing from a crystal phase to an amorphous phase and conversely, the crystal phase being conductive and the amorphous phase being poorly conductive. Such phase-change materials, for example, are chalcogenides. The conductivities of the crystal phase and of the amorphous phase of such materials may be by a high ratio, from $10^3$ to $10^6$.

A disadvantage of existing PCRAM structures is their high power consumption.

SUMMARY

The present disclosure provides a PCRAM cell having an improved performance.

The present disclosure provides a PCRAM cell having decreased power consumption.

An embodiment provides a memory cell comprising a via made of a phase-change material arranged between a lower electrode and an upper electrode, wherein the via comprises a central region laterally surrounded with a peripheral region, the crystallization and melting temperatures of the central region being respectively lower than those of the peripheral region.

According to an embodiment, the via made of a phase-change material has a height ranging between 30 and 100 nm and lateral dimensions ranging between 100 and 300 nm, and the central region of the via has lateral dimensions ranging between 20 and 90 nm.

According to an embodiment, the central region of the via made of phase-change material comprises implanted species.

According to an embodiment, the peripheral region of the via made of phase-change material comprises implanted species.

According to an embodiment, the phase-change material is germanium telluride and the implanted species are tin and antimony.

According to an embodiment, the phase-change material is germanium telluride and the implanted species are silicon.

According to an embodiment, the phase-change material is antimony telluride and the implanted species are tellurium.

According to an embodiment, the via made of phase-change material is laterally surrounded with an insulating material.

According to an embodiment, a first barrier layer is interposed between the lower electrode and the phase-change material, and a second barrier layer is interposed between upper electrode and the phase-change material.

An embodiment further provides a method for manufacturing a memory cell, comprising the steps of forming an opening in an insulating layer covering a first electrode formed on a substrate; filling the opening with a phase-change material to form a via; implanting species in a central region of the via made of phase-change material only, so that the crystallization and melting temperatures of this central region are respectively lower than those of a peripheral region of the via surrounding the central region; and covering the via with a second electrode.

An embodiment further provides a method for manufacturing a memory cell, comprising the steps of forming an opening in an insulating layer covering a first electrode formed on a substrate; filling the opening with a phase-change material to form a via; implanting species in a peripheral region of the via made of phase-change material only, so that the crystallization and melting temperatures of this peripheral region are respectively higher than those of a central region of the via surrounded with the peripheral region; and covering the via with a second electrode.

The foregoing and other features and advantages will be discussed in detail in the following non-limiting description of specific embodiments in connection with the accompanying drawings.

DETAILED DESCRIPTION

Figure 1:
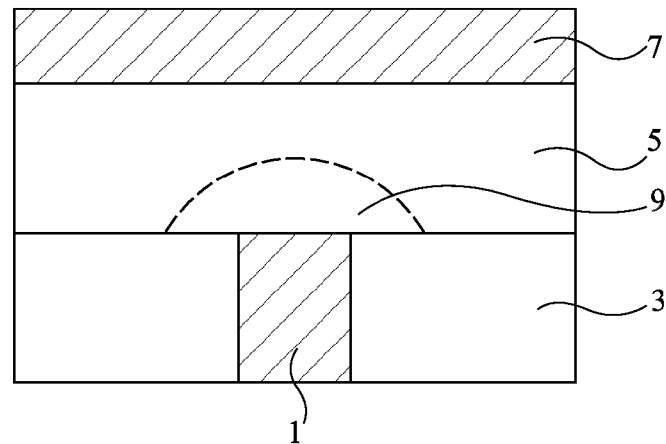
FIG. 1 is a cross-section view schematically showing an example of PCRAM cell.

For clarity, the same elements have been designated with the same reference numerals in the different drawings and, further, as usual in the representation of microelectronic components, the various drawings are not to scale.

FIG. 1 is a cross-section view schematically showing a conventional example of PCRAM cell.

A substrate, not shown, supports an electrode 1 surrounded with an insulating material 3. A phase-change material 5 covers electrode 1 and insulating material 3. Phase-change material 5 is covered with an electrode 7. Electrodes 1 and 7 have different dimensions, electrode 1 being narrower than electrode 7.

Such a PCRAM cell operates as follows.

An initial state in which phase-change material 5 is crystalline (conductive) is considered.

To pass from this conductive state to a resistive state, a short high voltage pulse is applied between the two electrodes 1 and 7. This causes a heating by Joule effect of phase-change material 5. Phase-change material 5 reaches its melting temperature in a region 9, delimited with dotted lines, close to the smallest electrode 1. Region 9 of phase-change material 5 melts, and then cools down in the amorphous (resistive) state.

To pass from the resistive state to the conductive state, a long low-voltage pulse is applied between the two electrodes 1 and 7. This causes a heating by Joule effect of phase-change material 5, which reaches its crystallization temperature in region 9. Region 9 of phase-change material 5 crystallizes and becomes conductive again.

Such PCRAM cells have reliability and retention issues. New PCRAM cell structures have thus been provided.

Figure 2:
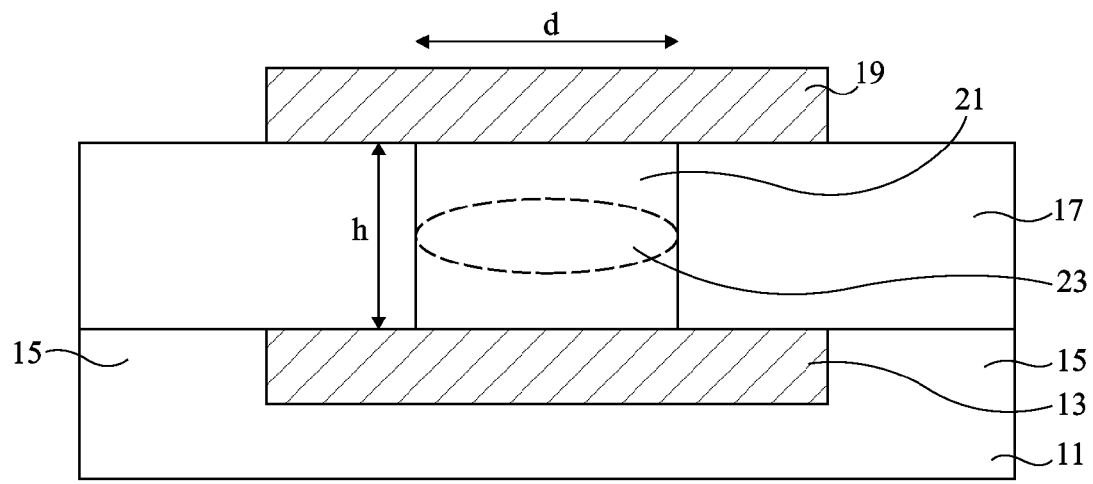
FIG. 2 is a cross-section view schematically showing a confined PCRAM cell.

FIG. 2 is a cross-section view schematically showing an example of a so-called confined PCRAM cell.

A substrate, not shown, supports an insulating layer 11 coated with a conductive layer 13 surrounded with an insulating material 15. Conductive layer 13 and insulating material 15 are covered with an insulating layer 17, itself covered with a conductive layer 19. A via 21 made of phase-change material crosses insulating layer 17 and extends from conductive layer 19 to conductive layer 13.

Conductive layers 13 and 19 respectively form the lower and upper electrodes of the PCRAM cell. Via 21 made of phase-change material forms the active area of the cell. In such a PCRAM cell, electrodes 13 and 19 have the same dimension.

The operation of this confined PCRAM cell is similar to that of the PCRAM cell illustrated in FIG. 1, except for the fact that, if electrodes 13 and 19 are of same dimension, the region of phase-change material 21 which passes from the crystal phase to the amorphous phase and conversely, delimited by dotted lines and designated with reference numeral 23, is located substantially at equal distance from electrodes 13 and 19. Further, region 23 extends over the entire horizontal section of via 21.

To decrease the power consumption of a confined PCRAM cell of the type illustrated in FIG. 2, it is desirable to decrease diameter d of via 21 made of phase-change material.

To form via 21, an opening is formed in insulating layer 17 and then filled with phase-change material. Phase-change materials, and especially chalcogenides, are generally deposited by sputtering. Conversely to CVD ("Chemical Vapor Deposition") methods, it is difficult, in the case of sputtering depositions, and more generally of PVDs ("Physical Vapor Deposition"), to fill openings having a form factor greater than 1, the form factor corresponding to the ratio of height h to diameter d of the opening.

Further, in a confined PCRAM cell of the type illustrated in FIG. 2, region 23 of phase-change material 21 which changes state has an elliptic vertical cross-section. This is due to the fact that thermal losses are greater in contact with thermally-conductive electrodes 13 and 19 than in contact with thermally-insulating material 17. This results in an increase of the power consumption of the confined PCRAM cell.

To decrease the effective diameter of the via made of phase-change material of a confined PCRAM cell while keeping a low form factor of the previously-formed opening, the inventors provide forming a via of large diameter, and then to deactivate the peripheral region of the via. To achieve this, species are implanted in the phase-change material, either in its central region, or in its peripheral region, so that the crystallization and melting temperatures of the peripheral region of the via are greater than those of the central region of the via. It is thus possible to modify the state of the central region without affecting the peripheral region.

Figure 3:
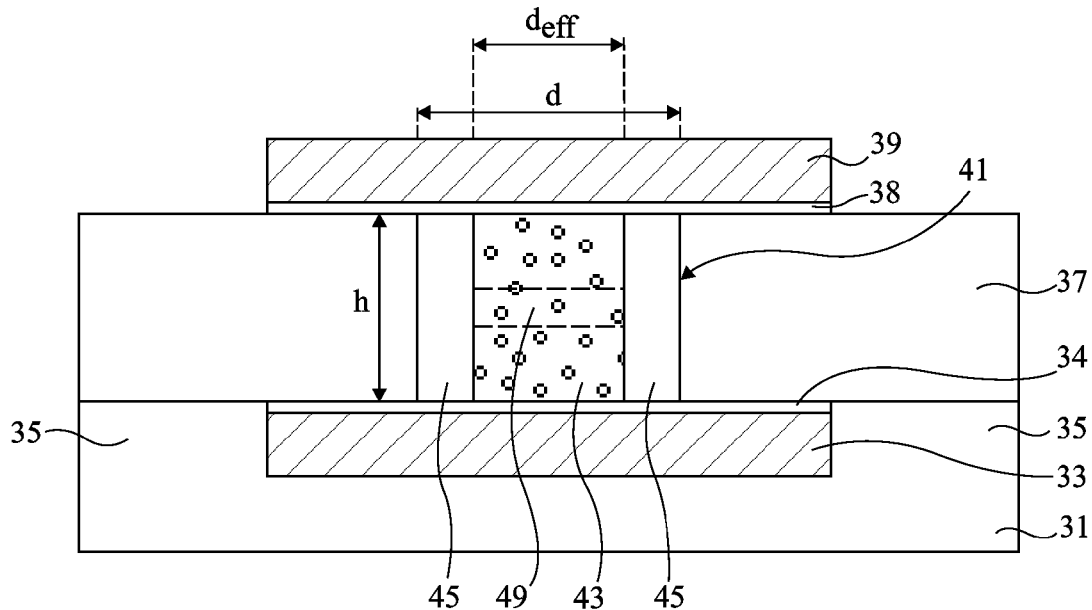
FIG. 3 is a cross-section view schematically showing a confined PCRAM cell having an increased performance.

FIG. 3 is a cross-section view schematically showing a confined PCRAM cell having a phase-change material via with a decreased effective diameter.

A substrate, not shown, for example made of silicon, supports an insulating layer 31 coated with a conductive layer 33 surrounded with an insulating material 35. Conductive layer 33 and insulating material 35 are covered with an insulating layer 37, itself covered with a conductive layer 39. A via 41 made of phase-change material crosses insulating layer 37 and extends from conductive layer 39 to conductive layer 33. Conductive layers 33 and 39 respectively form the lower and upper electrodes of the PCRAM cell. Via 41 for example has a circular, square, or rectangular cross-section.

Advantageously, barrier layers 34 and 38 are respectively interposed between conductive layer 33 and insulating layer 37 and between conductive layer 39 and insulating layer 37. Barrier layers 34 and 38 are intended to prevent the diffusion of metals from electrodes 33 and 39 to phase-change material 41 and insulating layer 37.

Electrodes 33 and 39 are, for example, made of aluminum silicide (AlSi) and for example have a thickness ranging between 50 and 500 nm. The barrier layers are for example made of titanium nitride (TiN) and for example have a thickness ranging between 5 and 50 nm. Insulating layers 31, 35, and 37 are for example made of silicon oxide.

Via 41 of phase-change material comprises a central region 43 surrounded with a peripheral region 45. Species have been implanted in central region 43 of via 41 so that the crystallization and melting temperatures of central region 43 are lower than those of peripheral region 45.

The active area of such a confined PCRAM cell corresponds to central region 43 of via 41 made of phase-change material, having a diameter $d_{\it eff}$ smaller than diameter d of via 41.

The thickness of insulating layer 37, and thus height h of via 41, for example ranges between 30 and 100 nm and for example is on the order of 50 nm. Lateral dimensions d of via 41 (diameter d of via 41 in the case where the via has a circular cross-section) for example range between 100 and 300 nm, and for example are on the order of 150 nm. Central region 43 of via 41 for example has lateral dimensions $d_{\it eff}$ ranging between 20 and 90 nm.

According to an embodiment, phase-change material 41 is made of germanium telluride ($Ge_{0.3}Te_{0.7}$) and central region 43 of material 41 comprises tin antimonide (SnSb). The crystallization and melting temperatures of peripheral region 45 made of $Ge_{0.3}Te_{0.7}$ respectively are approximately 250° C. and approximately 600° C., while the crystallization and melting temperatures of central region 43 having received an Sn and Sb implantation respectively are approximately 140° C. and approximately 475° C.

In such a confined PCRAM cell, the region of phase-change material 41 which passes from the crystal phase to the amorphous phase and conversely, delimited with dotted lines and designated with reference numeral 49, is located substantially at equal distance from electrodes 33 and 39 and only extends on the cross-section of diameter $d_{\it eff}$ of central region 43 of via 41. Peripheral region 45 of via 41 remains amorphous.

The operation of a confined PCRAM cell of the type illustrated in FIG. 3 is the following.

An initial state where central region 43 of via 41 made of phase-change material is crystalline (conductive) and peripheral region 45 of via 41 is amorphous (resistive) is considered.

To pass from this conductive state to a resistive state, a short high-voltage pulse is applied between electrodes 33 and 39, so that central region 43 of via 41 having received an implantation of species reaches its melting temperature, but not peripheral region 45, which has a higher melting temperature. Region 49 of central region 43 of via 41 melts, and then cools down in the amorphous (resistive) state.

To pass from the resistive state to the conductive state, a long low-voltage pulse is applied between electrodes 33 and 39, so that central region 43 of via 41 having received an implantation of species reaches its crystallization temperature, but not peripheral region 45, which has a higher crystallization temperature. Region 49 of central region 43 of via 41 crystallizes and becomes conductive again.

An advantage of a confined PCRAM cell of the type illustrated in FIG. 3 is that the effective diameter of the via made of phase-change material is decreased, which results in an increased performance of the PCRAM cell.

Another advantage of a confined PCRAM cell of the type illustrated in FIG. 3 is that it can be easily manufactured. Since form factor h/d of the opening made in insulating layer 37 to form via 41 is low, for example, lower than or equal to 1, the opening may be easily filled with a phase-change material, for example, by a PVD method.

Another advantage of a confined PCRAM cell of the type illustrated in FIG. 3 is that the thermal loss at the periphery of via 41 is decreased since amorphous peripheral region 45 of via 41 is more thermally insulating than insulating material 37. Region 49 of central region 43 of via 41 which changes phase is thinner than region 23 in the case of the PCRAM cell of FIG. 2. This results in a detection of the power consumption of the PCRAM cell.

Figure 4:
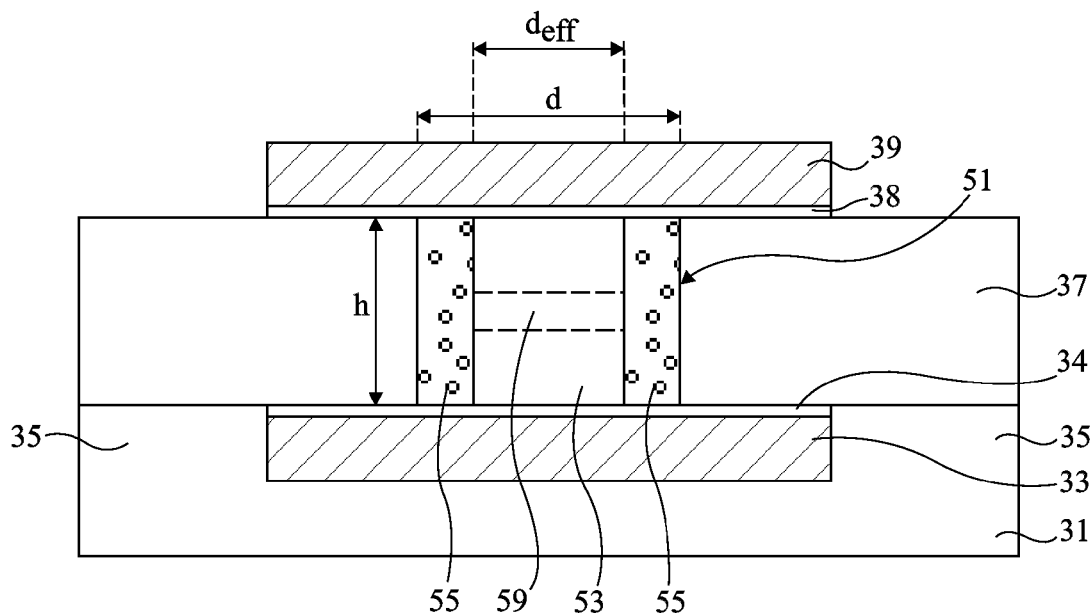
FIG. 4 is a cross-section view schematically showing a variation of the confined PCRAM cell of FIG. 3.

FIG. 4 is a cross-section view schematically showing a variation of the confined PCRAM cell of FIG. 3. The elements common with the PCRAM cell of FIG. 3 are designated with the same reference numerals.

A via 51 made of phase-change material crosses insulating layer 37 and extends from upper electrode 39 to lower electrode 33 (advantageously coated with barrier layers 38, 34). Via 51 of phase-change material comprises a central region 53 surrounded with a peripheral region 55. Species have been implanted in peripheral region 55 of via 51 so that the crystallization and melting temperatures of peripheral region 55 are higher than those of central region 53.

As for the confined PCRAM cell illustrated in FIG. 3, the active area of the confined PCRAM cell illustrated in FIG. 4 corresponds to central region 53 of via 51 made of phase-change material, having a diameter $d_{eff}$ smaller than diameter d of via 51.

Height h of via 51 for example ranges between 30 and 100 nm and for example is on the order of 50 nm. Lateral dimensions d of via 51 (diameter d of via 51 in the case where the via has a circular cross-section) for example range between 100 and 300 nm, and for example are on the order of 150 nm. Central region 53 of via 51, for example, has lateral dimensions $d_{eff}$ ranging between 20 and 90 nm.

According to a first embodiment, phase-change material 51 is made of antimony telluride ($Sb_{0.7}Te_{0.3}$) and peripheral region 55 of material 51 comprises tellurium (Te). The crystallization and melting temperatures of central region 53 made of $Sb_{0.7}Te_{0.3}$ respectively are approximately 95° C. and approximately 550° C., while the crystallization and melting temperatures of peripheral region 55 having received a Te implantation respectively are approximately 150° C. and approximately 620° C.

According to a second embodiment, phase-change material 51 is made of germanium telluride ($Ge_{0.5}Te_{0.5}$) and peripheral region 55 of material 51 comprises silicon (Si). The crystallization and melting temperatures of central region 53 made of GeTe respectively are approximately 180° C. and approximately 725° C., while the crystallization and melting temperatures of peripheral region 55 having received an Si implantation respectively are approximately 290° C. and approximately 885° C.

As with the confined PCRAM cell of FIG. 3, the region of phase-change material 51 which passes from the crystal phase to the amorphous phase and conversely, delimited with dotted lines and designated with reference numeral 59, is located substantially at equal distance from electrodes 33 and 39 and only extends on the cross-section of diameter $d_{eff}$ of central region 53 of via 51. Peripheral region 55 of via 51 remains amorphous.

The operation of such a confined PCRAM cell is similar to that of the confined PCRAM cell illustrated in FIG. 3.

An initial state where central region 53 of via 51 made of phase-change material is crystalline (conductive) and peripheral region 55 of via 51 is amorphous (resistive) is considered.

To pass from this conductive state to a resistive state, a short high-voltage pulse is applied between electrodes 33 and 39, so that central region 53 of via 51 reaches its melting temperature, but not peripheral region 55 having received an implantation of species, which has a higher melting temperature. Region 59 of central region 53 of via 51 melts, and then cools down in the amorphous (resistive) state.

To pass from the resistive state to the conductive state, a long low-voltage pulse is applied between electrodes 33 and 39, so that central region 53 of via 51 reaches its crystallization temperature, but not peripheral region 55 having received an implantation of species, which has a higher crystallization temperature. Region 59 of central region 53 of via 51 crystallizes and becomes conductive again.

FIGS. 5A to 5E are cross-section views schematically illustrating successive steps of a method for manufacturing a confined PCRAM cell of the type illustrated in FIG. 3.

Figure 5A:
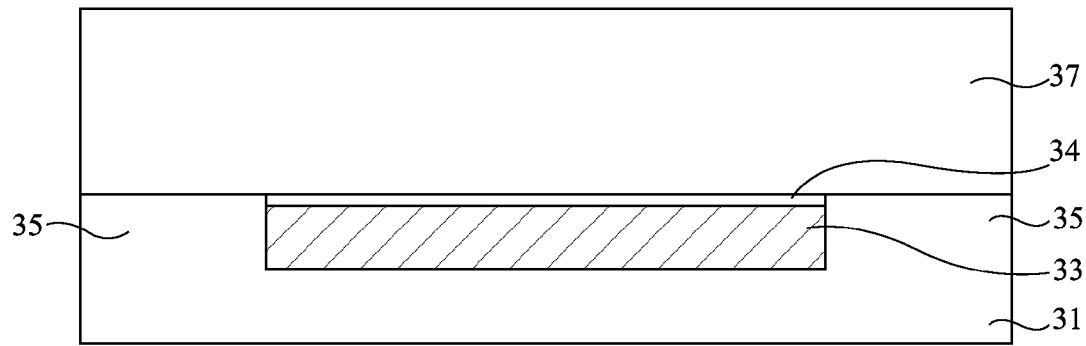
FIGS. 5A to 5E are cross-section views schematically illustrating successive steps of a method for manufacturing the confined PCRAM cell of FIG. 3.

FIG. 5A shows insulating layer 31 (supported by a substrate, not shown) coated with conductive layer 33, for example, made of AlSi, itself covered with barrier layer 34, for example, made of TiN. Layers 33 and 34 are surrounded with insulating material 35. Barrier layer 34 and insulating material 35 are covered with insulating layer 37. Conductive layer 33 forms the lower electrode of the PCRAM cell being formed.

Figure 5B:
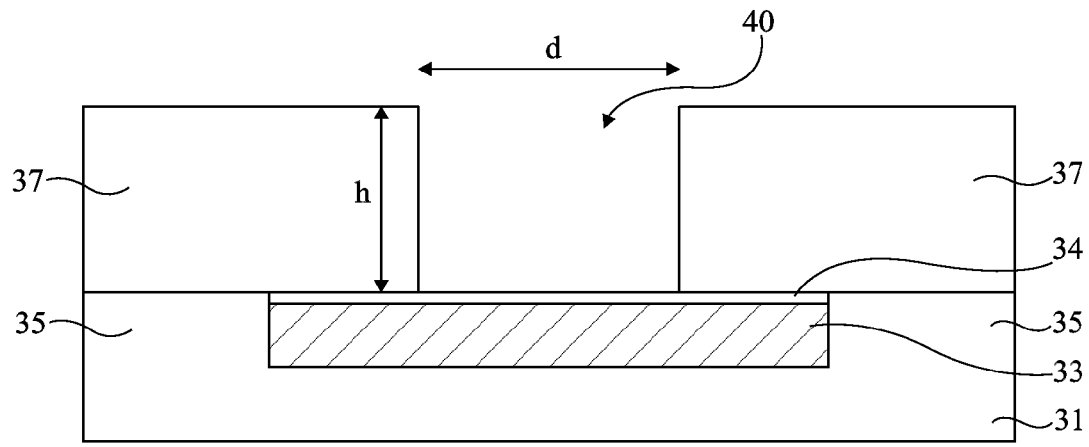

In FIG. 5B, an opening 40, of diameter d and of height h, has been formed from the upper surface of insulating layer 37 all the way to barrier layer 34.

Figure 5C:
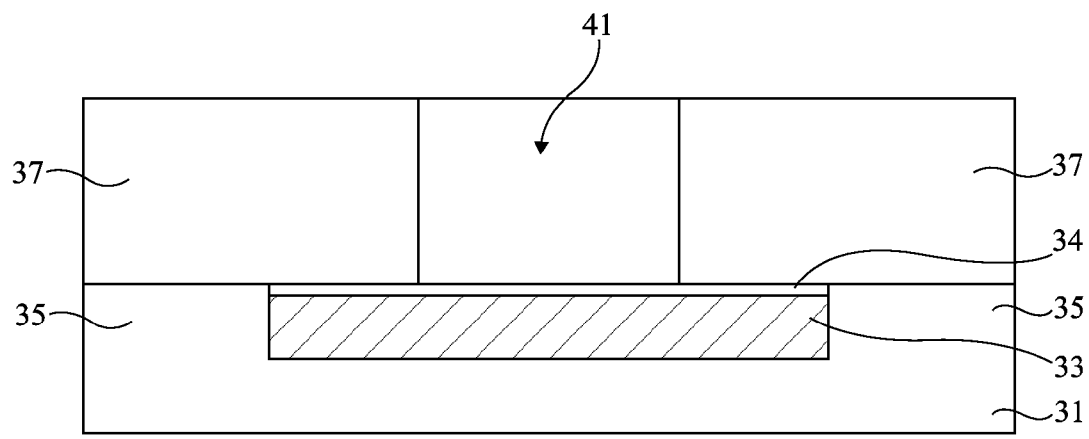

In FIG. 5C, opening 40 has been filled with a phase-change material, for example, germanium telluride, to form via 41. The phase-change material is, for example, deposited by a PVD method. A chemical mechanical polishing (CMP) is, for example, then performed, so that the upper surface of via 41 made of phase-change material is flush with the upper surface of insulating layer 37.

Figure 5D:
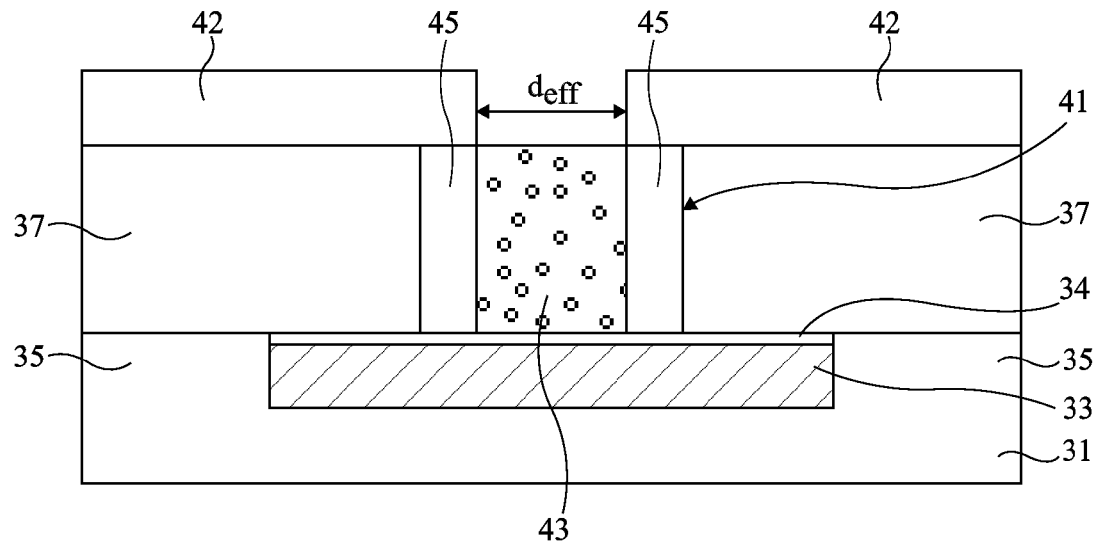

In FIG. 5D, species have been implanted in a central region 43 of diameter $d_{eff}$ of via 41 made of phase-change material. To achieve this, a mask 42 has been previously arranged above insulating layer 37 and above peripheral region 45 of via 41 where no species are desired to be implanted. The implanted species are for example tin antimonide or antimony. Once the species have been implanted in central region 43, an anneal is performed at a temperature lower than the crystallization temperature of phase-change material 41, so that peripheral region 45 remains amorphous.

Figure 5E:
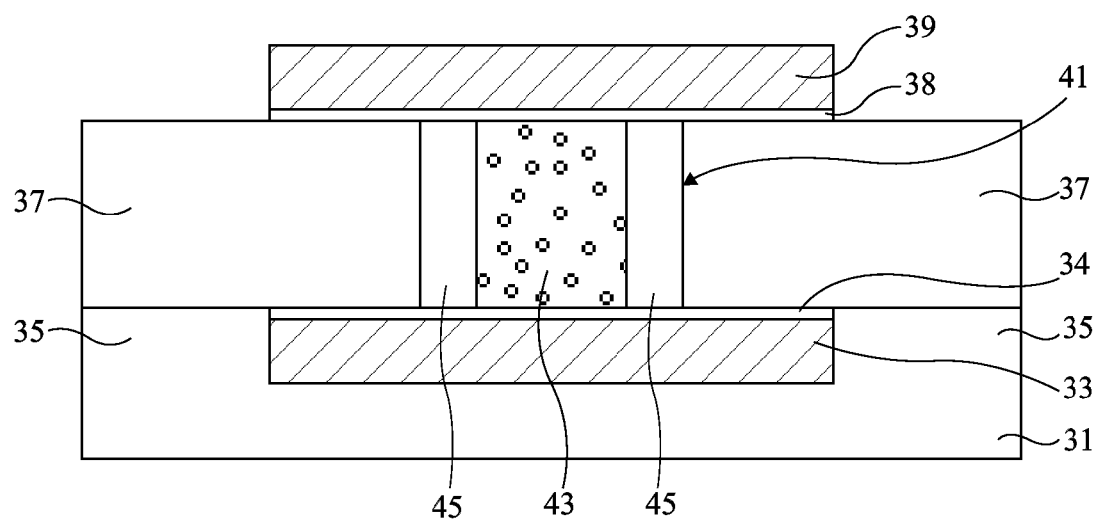

In FIG. 5E, a stack formed of barrier layer 38, for example, made of TiN, and of conductive layer 39, for example, made of AlSi, has been formed above via 41 made of phase-change material and above portions of insulating layer 37 surrounding via 41. Conductive layer 39 forms the upper electrode of the confined PCRAM cell.

To form a confined PCRAM cell of the type illustrated in FIG. 4, at the step illustrated in FIG. 5D, species are implanted in peripheral region 55 of via 51, central region 53 being protected by a mask. Once the species have been implanted in peripheral region 55, an anneal is performed at a temperature lower than the crystallization temperature of peripheral region 55, so that peripheral region 55 remains amorphous.

Specific embodiments of the present invention have been described. Various alterations, modifications, and improvements will occur to those skilled in the art. In particular, any phase-change material having crystallization and melting temperatures which may be significantly modified by implantation of species may be used.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A memory cell comprising;
a via formed in a layer having a height between a first surface and a second surface;
a lower electrode adjacent the first surface; and
an upper electrode adjacent the second surface,
wherein the via is filled with a phase-change material comprising a central region extending from the first surface to the second surface and a peripheral region laterally surrounding the central region and also extending from the first surface to the second surface, the crystallization and melting temperatures of the central region being respectively lower than the crystallization and melting temperatures of the peripheral region.

2. The memory cell of claim 1, wherein the height is between 30 and 100 nm and a lateral width of the via is between 100 and 300 nm, and wherein the central region of the via has a lateral width between 20 and 90 nm.

3. The memory cell of claim 1, wherein the central region of the via made of phase-change material comprises implanted species.

4. The memory cell of claim 1, wherein the peripheral region of the via made of phase-change material comprises implanted species.

5. The memory cell of claim 3, wherein the phase-change material is germanium telluride and the implanted species are tin and antimony.

6. The memory cell of claim 4, wherein the phase-change material is germanium telluride and the implanted species are silicon.

7. The memory cell of claim 4, wherein the phase-change material is made of antimony telluride and the implanted species are tellurium.

8. The memory cell of claim 1, wherein the via made of phase-change material is laterally surrounded with the layer comprising an insulating material.

9. A memory cell, comprising:
a via having a height between a lower electrode and an upper electrode,
wherein the via is filled with a phase-change material comprising a central region laterally surrounded with a peripheral region, each of the central and peripheral regions extending all along the height of the via, the crystallization and melting temperatures of the central region being respectively lower than the crystallization and melting temperatures of the peripheral region; wherein
a first barrier layer interposed between the lower electrode and the phase-change material, and
a second barrier layer interposed between the upper electrode and the phase-change material.

10. A memory cell, comprising:
a first insulating layer;
a first conductive plate formed in a top surface of the first insulating layer;
a second insulating layer covering the first conductive layer and first insulating layer, the second insulating layer including a via having a height equal to a thickness of the second insulating layer from a top surface to a bottom surface thereof;
a phase-change material filling said via, wherein the phase-change material includes a central region laterally surrounded with a peripheral region, wherein both the central region and the peripheral region extend from the top surface to the bottom surface of the second insulating layer; and
a second conductive plate covering the via at the top surface of the second insulating layer;
wherein a crystallization and melting temperatures of the central region are both lower than a crystallization and melting temperatures of the peripheral region.

11. The memory cell of claim 10, wherein one of the central region and the peripheral region includes a dopant species.

12. The memory cell of claim 11, wherein the dopant species is selected from the group consisting of: tin, antimony, silicon, and tellurium.

13. The memory cell of claim 10, further comprising a barrier layer positioned between the first conductive plate and a bottom of the phase-change material filled via.

14. The memory cell of claim 10, further comprising a barrier layer positioned between the second conductive plate and a top of the phase-change material filled via.

15. The memory cell of claim 10, wherein the crystallization and melting temperatures of the central region are both lower than the crystallization and melting temperatures of the peripheral region because the central region includes an introduced dopant.

16. The memory cell of claim 15, wherein the dopant is tin antimonide.

17. The memory cell of claim 10, wherein the crystallization and melting temperatures of the central region are both lower than the crystallization and melting temperatures of the peripheral region because the peripheral region includes an introduced dopant.

18. The memory cell of claim 15, wherein the dopant is selected from the group consisting of: tellurium and silicon.

* * * * *

UNITED STATES PATENT AND TRADEMARK OFFICE
CERTIFICATE OF CORRECTION

| | | |
|---|---|---|
| PATENT NO. | : 9,018,614 B2 | Page 1 of 1 |
| APPLICATION NO. | : 14/018223 | |
| DATED | : April 28, 2015 | |
| INVENTOR(S) | : Jean-Francois Nodin et al. | |

It is certified that error appears in the above-identified patent and that said Letters Patent is hereby corrected as shown below:

In the Claims:

At column 8, claim 9, line 5, delete "wherein".

Signed and Sealed this
Twenty-fifth Day of August, 2015

Michelle K. Lee
*Director of the United States Patent and Trademark Office*